(12) United States Patent
Jang

(10) Patent No.: US 8,120,877 B2
(45) Date of Patent: Feb. 21, 2012

(54) APPARATUS MINIMIZING IMPEDANCE IN FLEX-TO-PRINTED CIRCUIT BOARD CONNECTION THROUGH THE DISK BASE OF A HARD DISK DRIVE

(76) Inventor: Eun Kyu Jang, San Jose, CA (US)

( * ) Notice: Subject to any disclaimer, the term of this patent is extended or adjusted under 35 U.S.C. 154(b) by 565 days.

(21) Appl. No.: 12/327,720

(22) Filed: Dec. 3, 2008

(65) Prior Publication Data

US 2010/0134925 A1 Jun. 3, 2010

(51) Int. Cl.
*G11B 5/48* (2006.01)
(52) U.S. Cl. .................. 360/244; 360/245.2; 360/245.8; 360/245.9; 360/246
(58) Field of Classification Search .................. 360/244, 360/245.2, 245.8, 245.9, 246
See application file for complete search history.

(56) References Cited

U.S. PATENT DOCUMENTS

| | | | | |
|---|---|---|---|---|
| 6,163,443 A * | 12/2000 | Hatagami et al. | .......... | 360/245.9 |
| 6,349,009 B1 * | 2/2002 | Dakroub et al. | ........... | 360/245.9 |
| 6,519,110 B2 * | 2/2003 | Dague et al. | ............... | 360/245.8 |
| 6,636,383 B1 * | 10/2003 | Chew | ......................... | 360/245.9 |
| 6,680,813 B2 * | 1/2004 | Dague et al. | ............... | 360/245.8 |
| 6,741,426 B2 * | 5/2004 | Girard | ......................... | 360/245.8 |
| 6,940,697 B2 * | 9/2005 | Jang et al. | .................... | 360/245.9 |
| 7,064,928 B2 * | 6/2006 | Fu et al. | ..................... | 360/245.9 |
| 7,433,157 B2 * | 10/2008 | Arya et al. | .................... | 360/246 |
| 7,450,346 B2 * | 11/2008 | Arya et al. | ................. | 360/245.8 |
| 7,525,767 B2 * | 4/2009 | Erpelding | ................. | 360/245.8 |
| 7,542,231 B2 * | 6/2009 | Rugg et al. | ................. | 360/245.9 |
| 7,595,963 B1 * | 9/2009 | Chen et al. | ................. | 360/245.9 |
| 7,830,638 B1 * | 11/2010 | Jiang et al. | ................. | 360/245.9 |

* cited by examiner

Primary Examiner — Trong Phan

(57) ABSTRACT

This application discloses a hard disk drive, a head stack assembly, and a printed circuit board configured to include impedance patches on the flex ground plane, the flex power plane, the printed circuit ground plane and/or the printed circuit power plane over or under a connector site in the disk base that conveys access read and write differential signals for the sliders' access of rotating disk surfaces. These impedance patches minimize impedance discontinuities in the read and/or write differential signals through the connector site, which may improve the ability of the hard disk drive to transmit these signals at higher frequencies.

14 Claims, 7 Drawing Sheets

APPARATUS MINIMIZING IMPEDANCE IN FLEX-TO-PRINTED CIRCUIT BOARD CONNECTION THROUGH THE DISK BASE OF A HARD DISK DRIVE

TECHNICAL FIELD

This invention relates to hard disk drives with connectors between a main flex circuit on their head stack assembly and a printed circuit board on the opposite side of the disk base from the head stack assembly.

BACKGROUND OF THE INVENTION

For many years, it has been common to place a printed circuit board on the opposite side of the disk base from the disks and voice coil motor in a hard disk drive. The electrical interface between the sliders and the printed circuit board frequently includes a main flex circuit that uses a preamplifier integrated circuit that buffers the write differential signal from the printed circuit board and the read differential signal going to the printed circuit board. The main flex circuit is electrically coupled through a flex ribbon to a flex circuit interface that goes through a connector site to electrically couple to the printed circuit board.

As the hard disk drives grow in memory capacity, there is a need particularly for the differential signal paths to be able to operate at higher frequencies. This invention addresses this need.

SUMMARY OF THE INVENTION

Embodiments of the invention include a hard disk drive comprising a head stack assembly containing at least one slider to access a rotating disk surface and a main flex circuit communicatively coupled to the slider to communicate the access to a flex circuit interface positioned in a through connector site in the disk base, with the flex circuit interface including a flex ground plane and/or a flex power plane with at least one flex impedance patch over the connector site. The hard disk drive further comprises a printed circuit board mounted on the disk base and communicatively coupled to the flex circuit interface, with the printed circuit board comprising a printed circuit ground plane and/or power plane with at least one printed circuit impedance patch under the connector site.

Such embodiments may have smaller impedance discontinuities in the read differential and/or write differential signal paths through the connector site of the hard disk drive thereby supporting higher transmission frequencies for such signals. This may improve the ability of the hard disk drive to operate at higher data capacities.

Embodiments of the invention also include the head stack assembly electrically coupled to the flex circuit interface and the printed circuit board configured to communicatively couple with the flex circuit interface under the through connector site. Any of the ground planes and/or power planes may further include more than one flex impedance patch, which may or may not be the same shape and/or size. The impedance patches may form a two dimensional grid.

DETAILED DESCRIPTION

This invention relates to hard disk drives with connectors between a main flex circuit on their head stack assembly and a printed circuit board on the opposite side of the disk base from the head stack assembly. Embodiments of the invention include a hard disk drive comprising a head stack assembly containing at least one slider to access a rotating disk surface and a main flex circuit communicatively coupled to the slider to communicate the access to a flex circuit interface positioned in a through connector site in the disk base, with the flex circuit interface including a flex ground plane and/or a flex power plane with at least one flex impedance patch over the connector site. The hard disk drive further comprises a printed circuit board mounted on the disk base and communicatively coupled to the flex circuit interface, with the printed circuit board comprising a printed circuit ground plane and/or power plane with at least one printed circuit impedance patch under the connector site.

Figure 1:
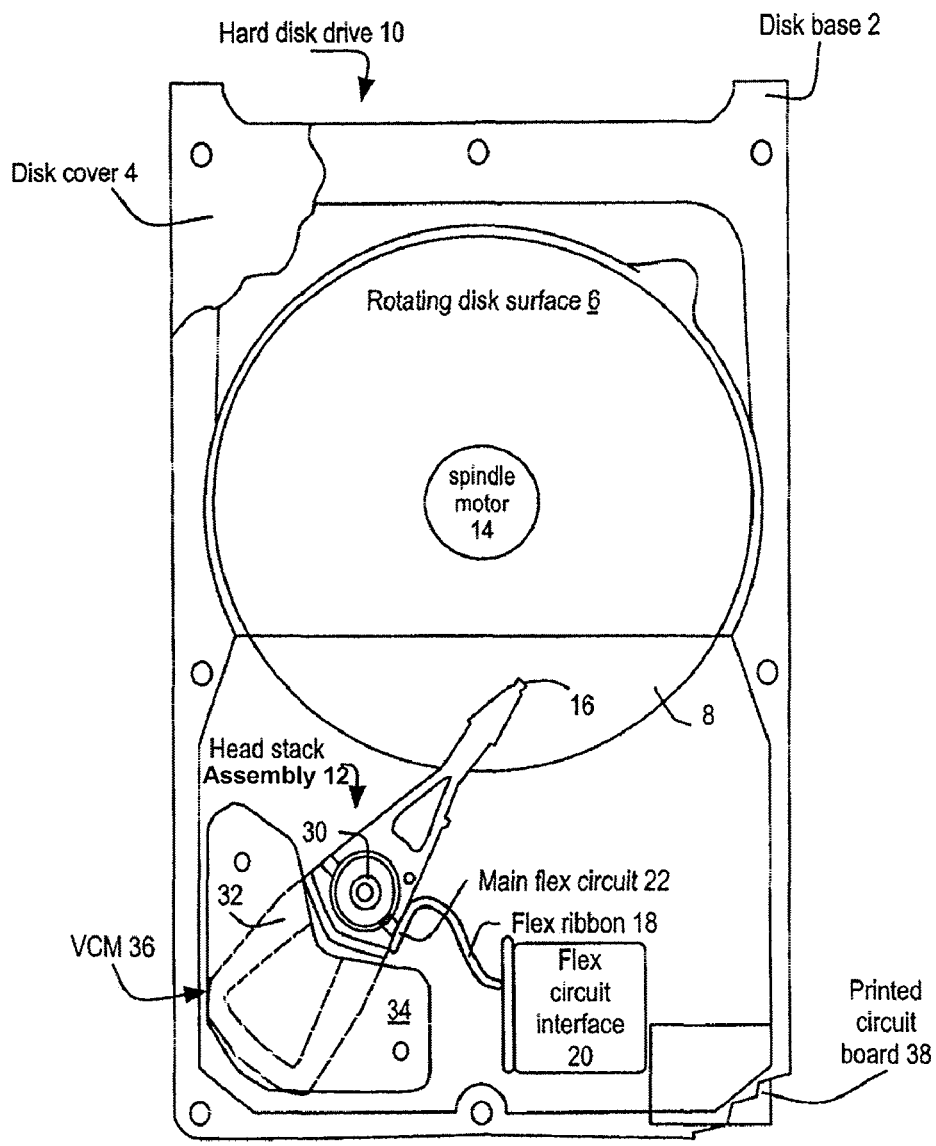
FIG. 1 shows a top view of an example of an embodiment of the invention as a hard disk drive including a disk base to which a spindle motor is mounted to rotate at least one disk to create a rotating disk surface. A head stack assembly is pivotably mounted to the disk base to position at least one slider to access data stored on the rotating disk surface. The head stack assembly also includes a main flex circuit communicatively coupled to the slider and through a flex ribbon to a flex circuit interface that communicates the disk access with a printed circuit board mounted on the other side of the disk base.
Figure 2:
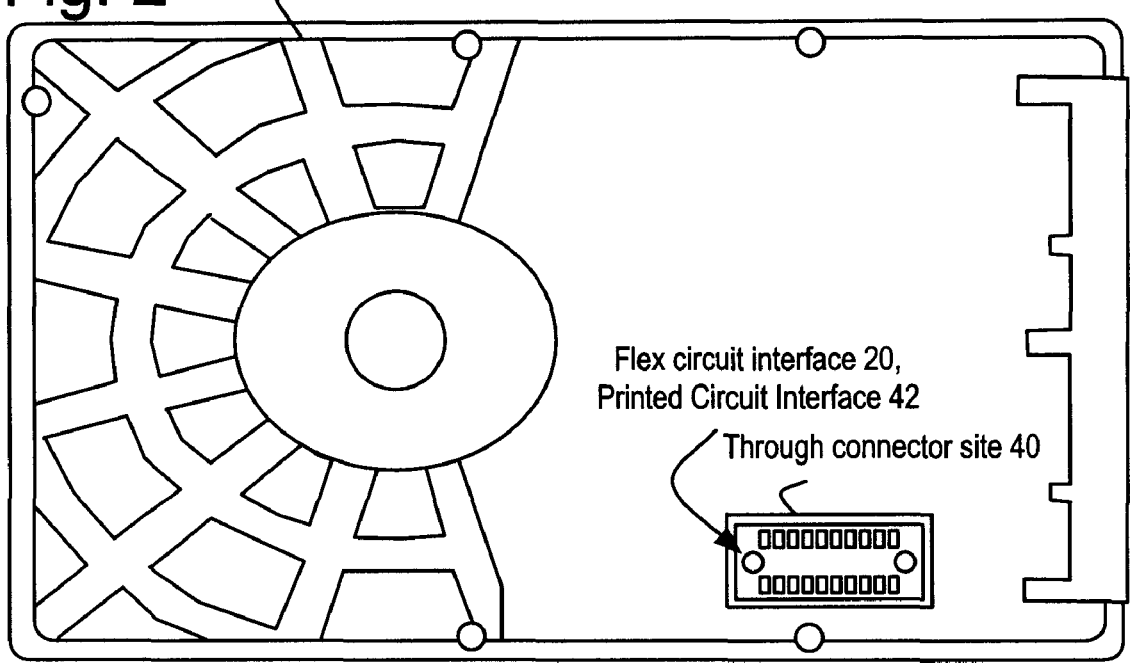
FIG. 2 shows the bottom view of the disk base and its through connector site with the flex interface mounted to provide the printed circuit interface in the through connector site.
Figure 9A:
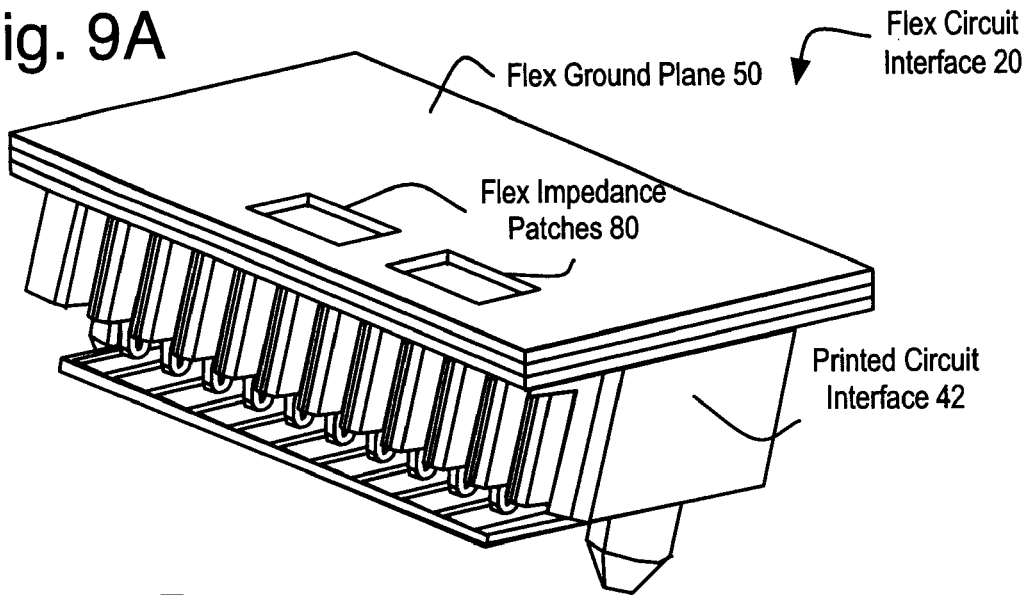
FIGS. 9A and 9B show perspective views of the top and bottom of the flex circuit interface coupled to the printed circuit with their ground planes including impedance patches.
Figure 9B:
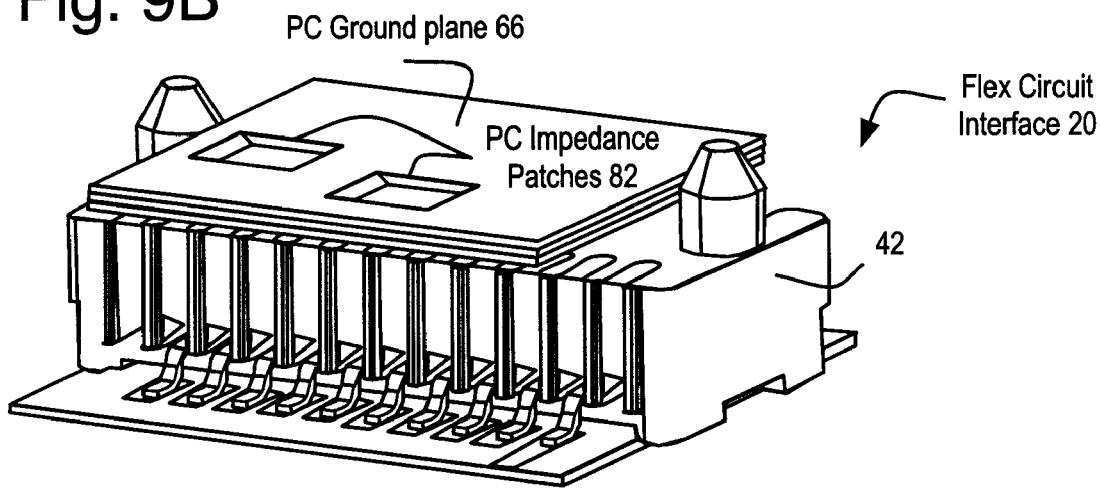
Figure 11:
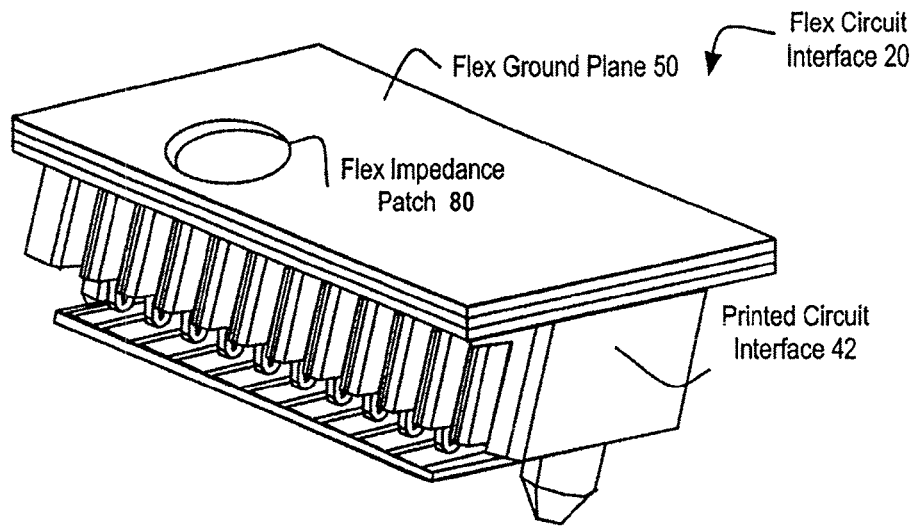
FIG. 11 shows an example of the flex circuit interface with the flex ground plane including a flex impedance patch that is elliptical.
Figure 12:
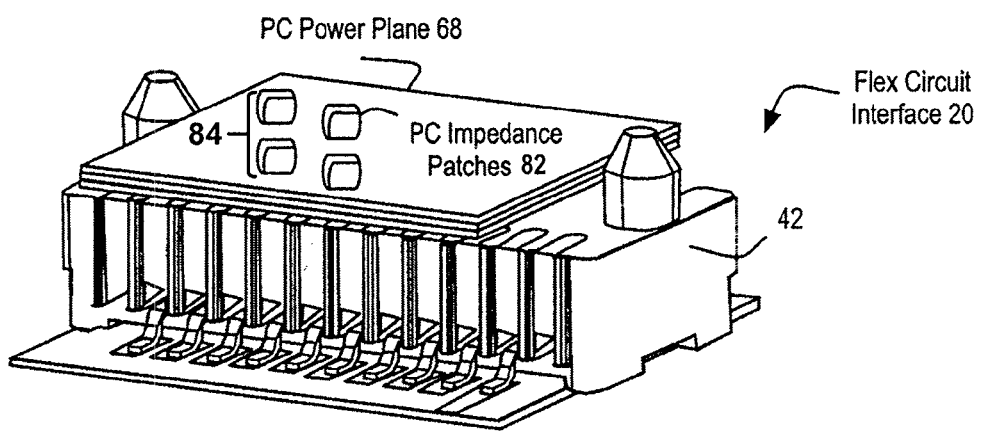
FIG. 12 shows an example of the printed circuit board with the printed circuit power plane including a two dimensional grid 84 of printed circuit impedance patches that are rectangular with rounded corners.

To summarize the Figures, embodiments of the invention include a hard disk drive 10 that may comprise a disk base 2 with a through connector site 40 as shown in FIG. 2, and a spindle motor 14 mounted on the disk base to rotate at least one disk 8 to create at least one rotating disk surface 6 as shown in FIG. 1. The hard disk drive also comprises a head stack assembly 12 pivotably mounted to the disk base that contains at least one slider 16 to access the rotating disk surface and a main flex circuit 22 communicatively coupled to the slider to communicate the access to a flex circuit interface 20 positioned through the connector site, with the flex circuit interface including a flex ground plane 50 with at least one flex impedance patch 80 over the connector site as shown in FIGS. 9A and 11, and/or a flex power plane with at least one of the flex impedance patches. The hard disk drive may further comprise a printed circuit board 38 mounted on the disk base and communicatively coupled to the flex circuit interface, with the printed circuit board comprising a printed circuit ground plane 66 with at least one printed circuit impedance patch 82 under the connector site as shown in FIG. 9B and/or the printed circuit power plane 68 may include one of the printed circuit impedance patches as shown in FIG. 12.

Referring to the drawings more particularly, FIG. 1 shows an example of an embodiment of the invention as a hard disk drive 10 including a disk base 2 to which a spindle motor 14 is mounted with at least one disk 8 rotatably coupled to the spindle motor to create a rotating disk surface 6. A voice coil motor 36 may include a head stack assembly 12 pivotably mounted by an actuator pivot 30 to the disk base, responsive to its voice coil 32 interacting with a fixed magnetic assembly 34 mounted on the disk base and including at least one slider 16 to access data stored on the rotating disk surface. The hard disk drive includes a printed circuit board 38 also mounted on the disk base opposite the spindle motor and the voice coil motor. The slider is communicatively coupled to the main flex circuit 22 that uses a flex ribbon 18 to communicate the access of the slider to the flex circuit interface that is communicatively coupled to the printed circuit board 38. A disk cover 4 is mounted on the disk base to encapsulate all of the shown components except the printed circuit board.

The hard disk drive 10 preferably accesses the data arranged in tracks on the rotating disk surface 6 by controlling the spindle motor 14 to rotate the disks 8 at a preferred rate. The data may be organized as tracks that may be configured as concentric circles or as a tightly packed spiral. The voice coil motor 36 operates by stimulating the voice coil 32 with a time varying electrical signal to magnetically interact with the fixed magnet assembly 34 causing the head stack assembly 12 to pivot about the actuator pivot 30 moving to position the slider 16 near the track on the rotating disk surface. In many embodiments, a micro-actuator assembly possibly coupled to the slider may be further stimulated to further control the position of the slider. A vertical micro-actuator either in the micro-actuator assembly, or in the slider, may be stimulated to alter the flying height of the slider over the rotating disk surface.

FIG. 2 shows the bottom side of the disk base 2 of FIG. 1 with the flex circuit interface 20 showing its printed circuit interface 42 inserted into the through connector site 40 included in the disk base.

Figure 3:
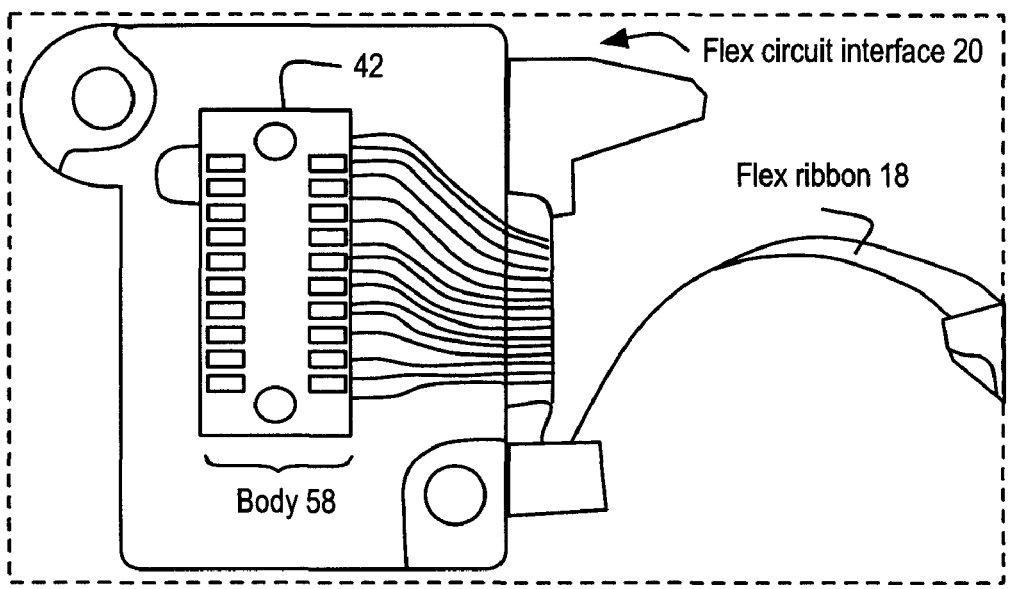
FIG. 3 shows the bottom view of the flex circuit interface with the flex ribbon communicatively coupled to the printed circuit interface across the body of the connector.

FIG. 3 shows a bottom view of some details of the flex circuit interface 20 including the printed circuit interface 42 on the body 58, communicatively coupled to the flex ribbon 18.

Figure 4A:
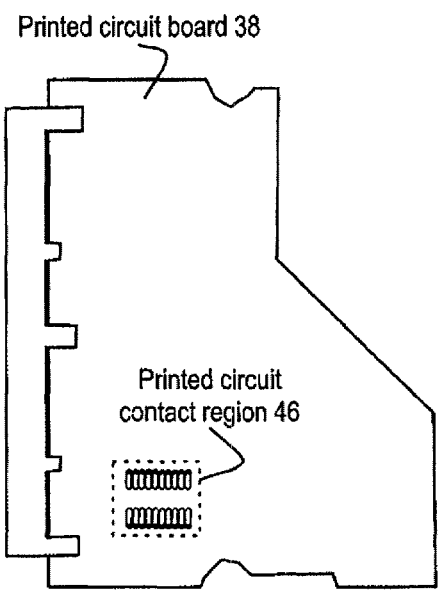
FIG. 4A shows the top view of the printed circuit board with the printed circuit contact region highlighted, which is where the printed circuit board connects to the printed circuit interface.
Figure 4B:
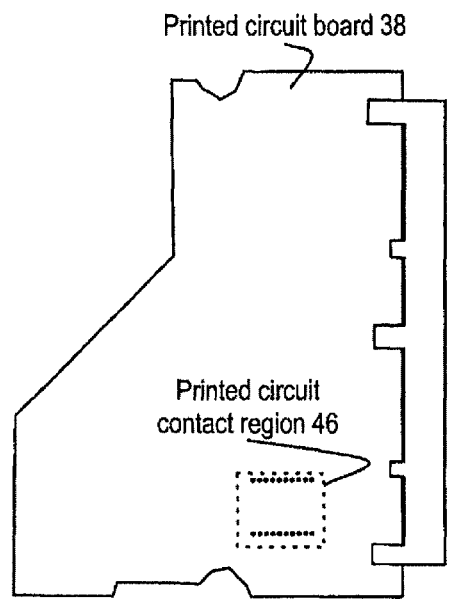
FIG. 4B shows the bottom view of the printed circuit board, which does not contact the printed circuit interface.

FIGS. 4A and 4B show two sides of the printed circuit board 38 with a printed circuit contact region 46. FIG. 4A shows the top side which makes contact with the printed circuit interface 42 and FIG. 4B shows the bottom side facing away from the disk base 2 and the printed circuit interface.

Figure 5:
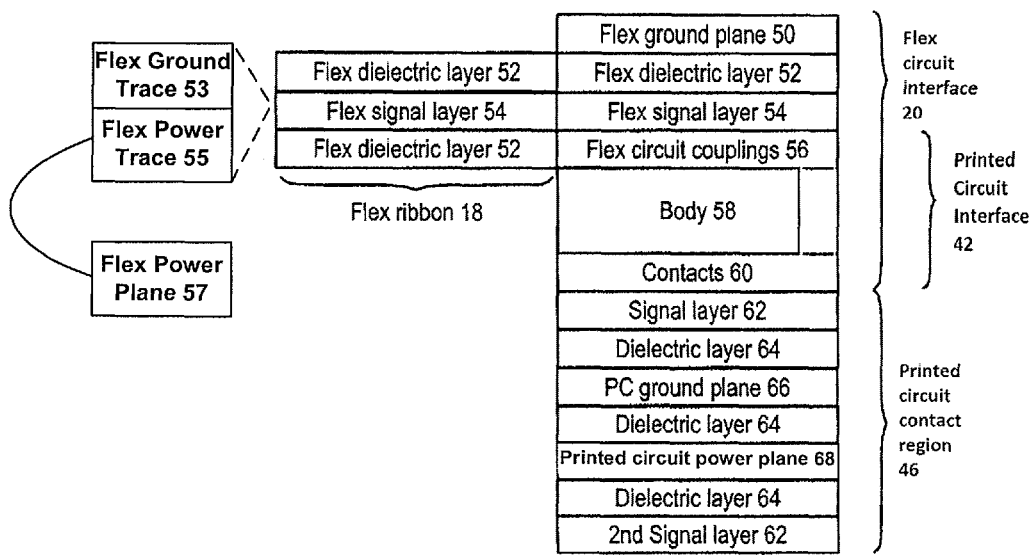
FIG. 5 shows a simplified layer diagram of the flex ribbon, the flex circuit interface and the printed circuit contact region.

FIG. 5 shows a simplified layer diagram of the flex ribbon 18 coupled to the flex circuit interface 20 that is communicatively coupled to the printed circuit board 38 in the printed circuit contact region 46. The flex ribbon may include a flex ribbon signal layer 70 and two flex dielectric layers 52. The flex ribbon may include a flex ground trace 53 and a flex power trace 55 as part of the flex signal layer 54. The flex circuit interface may include the following layers separated by flex dielectric layers: a flex ground layer 50 over a flex signal layer 54 that is electrically coupled to the flex circuit couplings 56 of the printed circuit interface. Preferably, the flex ground trace 53 may be electrically coupled to the flex ground plane. Also, the flex power trace 55 may be electrically coupled to the flex power plane 57, which has not been shown. One or more of the flex dielectric layers of the flex ribbon may be coupled to one of the flex dielectric layers of the flex circuit interface as shown. The printed circuit interface 42 may include the flex circuit couplings on top supported by a body 58 and electrically coupled with contacts 60 on the bottom, that electrically couple to a signal layer 62 in the printed circuit contact region as shown in FIG. 4A. The printed circuit contact region may further include the signal layer over a dielectric layer 64 that is over a printed circuit power plane 68 separated by another dielectric layer from a printed circuit ground plane 66 frequently with a second signal layer. In certain embodiments, there may be a rigid substrate that may be formed as one of the dielectric layers.

Frequently the flex dielectric layers 52 and/or the printed circuit dielectric layers 64 may be formed of a polyimide compound. The flex signal layers 54 and/or the printed circuit signal layers 62 may be made of a conductive metal such as copper. The flex ground plane 50 and/or the printed circuit ground plan 66 may also be made of a conductive metal such as copper. These layers may be successively deposited and etched to form the circuits shown in these Figures. In the electrical coupling of the contacts 60 and the signal layer 62 it may be preferred that a layer of nickel followed by a layer of gold may be deposited to create the electrical coupling between the flex circuit coupling and the printed circuit board 38 signals.

Figure 6A:
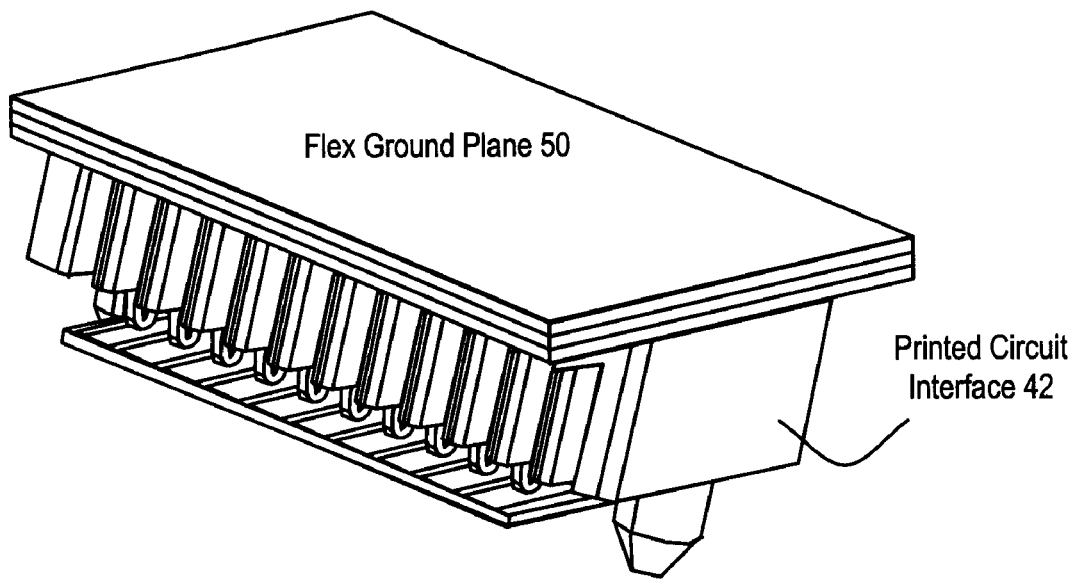
FIGS. 6A and 6B show perspective views of the top and the bottom of the prior art flex circuit interface electrically coupled with the printed circuit board showing ground planes as essentially uniform sheets of conductive material. The power planes are also essentially uniform sheets of conductive material.
Figure 6B:
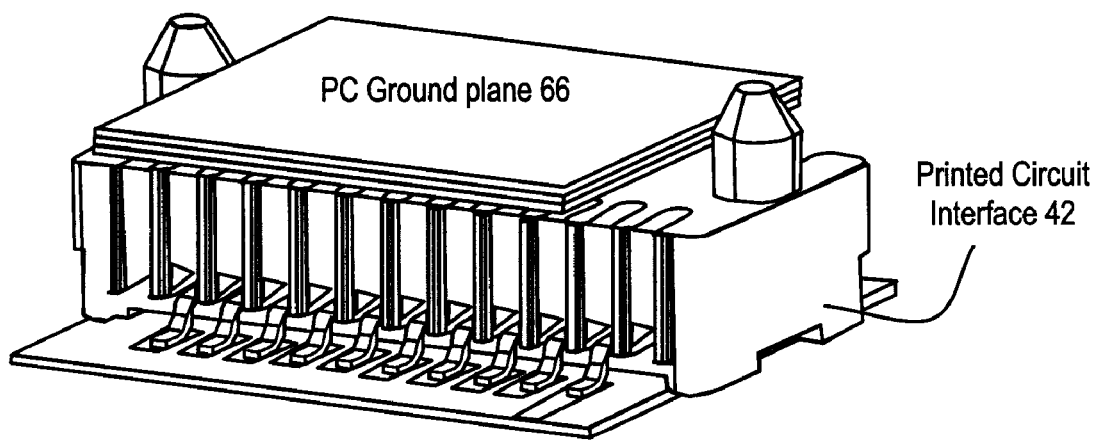

FIG. 6A shows a prior art flex ground plane 50 over the printed circuit interface as essentially a uniform sheet of conductive material such as copper. Also FIG. 6B shows the printed circuit ground plane 66 under the printed circuit interface as another essentially uniform sheet of conductive material. The printed circuit power plane 68 may be an essentially uniform sheet of conductive material.

Figure 7:
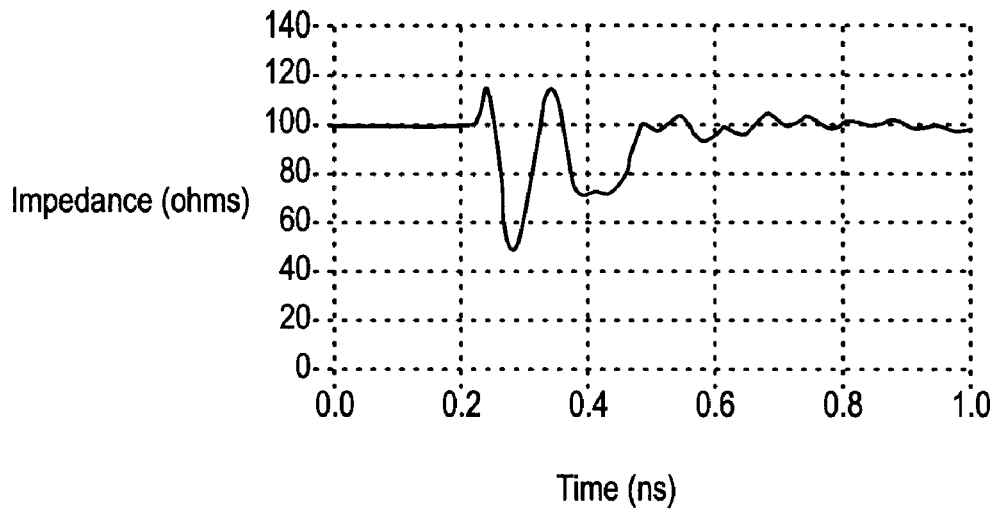
FIG. 7 shows a graph of the simulated impedance discontinuities found in read and/or write differential signals near the prior art flex circuit interface and its electrical coupling to the prior art printed circuit board.

FIG. 7 shows the problem encountered by the inventor regarding such configurations in this graph of a simulated time domain reflectometer, that the differential signals for the read and write differential signals experience impedance discontinuities passing through the flex circuit interface 20 to the printed circuit board 38 as shown.

These fluctuations may be the result of the signal path between a preamplifier residing in the main flex circuit 22 and a channel interface circuit of the printed circuit board 38 forming a parasitic capacitance between the flex ground plane 50, the flex signal layer 54, the flex circuit couplings 56, the contacts 60, the signal layer 62 and the printed circuit ground layer 66. This parasitic capacitance in turn may incorporate a parasitic inductance produced by the trace conductors and these components. This example shows one inductive peak and two capacitive dips. The parasitic capacitance and parasitic inductance may cause a resonance near the data transmission frequency, which if it occurs may degrade reading data at higher frequencies.

Figure 8:
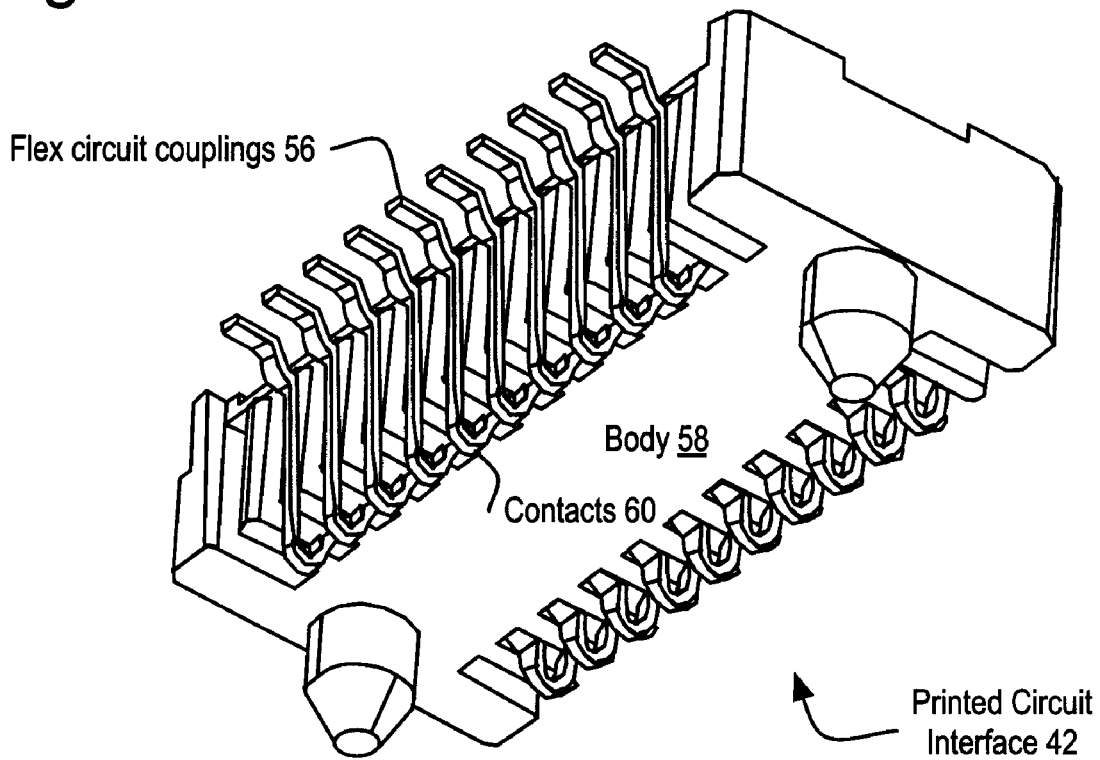
FIG. 8 shows a perspective view of the printed circuit interface its body, the flex circuit couplings and the contacts in greater detail.

FIG. 8 shows a perspective view of an example of the printed circuit interface 42 including the flex circuit coupling 56 electrically coupling across the body 58 to the contacts 60.

FIG. 9A shows an example of the flex circuit interface 20 including at least one, and in this example, two flex impedance patches 80 in the flex ground plane 50 over the printed circuit interface.

FIG. 9B shows an example of the printed circuit ground plane 66 including at least one, and in this example, two printed circuit impedance patches 82 under the flex circuit interface.

The impedance patches 80 and 82 may be formed by punching and/or etching holes in the ground planes 50 and 66 near the contacts for the read and/or write differential signals. These impedance patches act to reduce the surface area of the ground planes near the contacts for these signals, which tends to reduce the parasitic capacitance and possibly also reduce the parasitic inductance as well.

Such embodiments of the hard disk drive 10 may have smaller impedance discontinuities in the read differential and/or write differential signal paths through the connector site 40 of the hard disk drive thereby supporting higher transmission frequencies for such signals. This may improve the ability of the hard disk drive to operate at higher data capacities. This aspect of the invention is shown through the comparison of the graph of FIG. 7 to the graph of FIG. 10.

Figure 10:
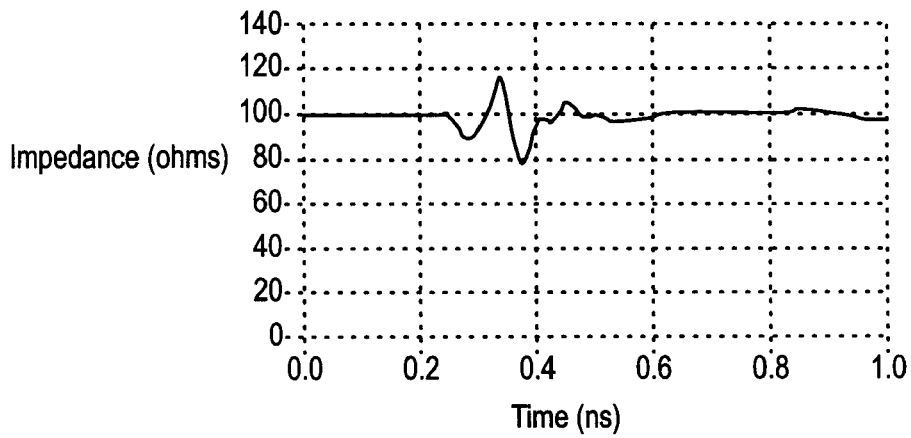
FIG. 10 shows a graph of the improvement in the simulated impedance discontinuities of the read and/or write differential signals near the flex circuit interface and its electrical coupling to the printed circuit board.

FIG. 10 shows the simulated time domain reflectometer for the configuration using the impedance patches 80 and 82 of FIGS. 9A and 9B, showing a significant reduction in impedance discontinuities over the prior art simulation shown in FIG. 7.

FIGS. 11 and 12 show some examples of alternative embodiments of the invention. FIG. 11 shows a perspective view of the top of the flex circuit interface 20 with the flex ground plane 50 including a flex impedance patch 80 in an elliptical shape. And FIG. 12 as shows a perspective view of the bottom of the flex circuit interface 20 with the printed circuit power plane 68 including a two dimensional grid of the printed circuit impedance patches 82 as rectangles with rounded corners.

Other embodiments of the invention may include the flex power plane instead of the flex ground plane 50 including flex impedance patches 80 that may or may not align one on top of the other and/or may or may not have the same shape. Similarly, the printed circuit ground plane 66 and the printed circuit power plane 68 may both include printed circuit impedance patches 82 that may or may not align one on to of the other and/or may or may not have the same shape.

The preceding embodiments provide examples of the invention, and are not meant to constrain the scope of the following claims.

What is claimed is:

1. A hard disk drive, comprising:
a disk base comprising a through connector site;
a spindle motor mounted on said disk base to rotate at least one disk to create at least one rotating disk surface;
a head stack assembly pivotably mounted on said disk base comprising
at least one slider for accessing said rotating disk surface,
a main flex circuit communicatively coupled to said slider to communicate said access to a flex circuit interface positioned through said connector site,
said flex circuit interface comprising a flex ground plane with a flex impedance patch over said connector site; and
a printed circuit board mounted on said disk base and communicatively coupled to said flex circuit interface, said printed circuit board comprising a printed circuit ground plane with a printed circuit impedance path under said connector site.

2. The hard disk drive of claim 1, wherein said flex ground plane comprises at least two of said flex impedance patches near said connector site.

3. The hard disk drive of claim 2, wherein said flex ground impedance patches form a two dimensional grid.

4. The hard disk drive of claim 1, wherein said printed circuit ground plane comprises at least two of said printed circuit impedance patches near said connector site.

5. The hard disk drive of claim 4, wherein at least two of said printed circuit impedance patches are essentially the same size.

6. The hard disk drive of claim 4, wherein said printed circuit ground impedance patches form a two dimensional grid.

7. The hard disk drive of claim 1, wherein said flex interface circuit further comprises a flex power plane with at least one of said flex impedance patches.

8. The hard disk drive of claim 1, wherein said printed circuit board further comprises a printed circuit power plane with at least one of said printed circuit impedance patches.

9. A hard disk drive, comprising:
a disk base comprising a through connector site;
a spindle motor mounted on said disk base to rotate at least one disk to create at least one rotating disk surface;
a head stack assembly pivotably mounted on said disk base comprising
at least one slider for accessing said rotating disk surface,
a main flex circuit communicatively coupled to said slider to communicate said access to a flex circuit interface positioned through said connector site,
said flex circuit interface comprising a flex power plane with a flex impedance patch over said connector site; and
a printed circuit board mounted on said disk base and communicatively coupled to said flex circuit interface, said printed circuit board comprising a printed circuit power plane with a printed circuit impedance path under said connector site.

10. A head stack assembly for use in a hard disk drive, comprising:
at least one slider for accessing a rotating disk surface including in said hard disk drive; and
a main flex circuit communicatively coupled to said slider to communicate said access to a flex circuit interface positioned through a connector site in a disk base of said hard disk drive,
said flex circuit interface comprising at least one member of the group consisting of
a flex ground plane with at least one flex impedance patch configured to be above said connector site, and
a flex power plane with at least one of said flex impedance patches configured to be above said connector site.

11. The head stack assembly of claim 10, wherein said flex ground plane comprises at least two of said flex impedance patches near said connector site.

12. The head stack assembly of claim 11, wherein at least two of said flex impedance patches are essentially the same size.

13. The head stack assembly of claim 11, wherein said flex ground impedance patches form a two dimensional grid.

14. The head stack assembly of claim 10, wherein said flex interface circuit further comprises a flex power plane with at least one of said flex impedance patches.

* * * * *